United States Patent
Wang et al.

(10) Patent No.: US 8,289,759 B2
(45) Date of Patent: Oct. 16, 2012

(54) NON-VOLATILE MEMORY CELL WITH PRECESSIONAL SWITCHING

(75) Inventors: Xiaobin Wang, Chanhassen, MN (US); Yong Lu, Edina, CA (US); Haiwen Xi, San Jose, CA (US); Yuankai Zheng, Fremont, CA (US); Yiran Chen, Eden Prairie, MN (US); Harry Hongyue Liu, Maple Grove, MN (US); Dimitar V. Dimitrov, Edina, MN (US); Wei Tian, Bloomington, MN (US); Brian S. Lee, Boston, MA (US)

(73) Assignee: Seagate Technology LLC, Scotts Valley, CA (US)

( * ) Notice: Subject to any disclaimer, the term of this patent is extended or adjusted under 35 U.S.C. 154(b) by 12 days.

(21) Appl. No.: 13/091,372

(22) Filed: Apr. 21, 2011

(65) Prior Publication Data
US 2011/0194337 A1 Aug. 11, 2011

Related U.S. Application Data

(63) Continuation of application No. 12/364,589, filed on Feb. 3, 2009, now Pat. No. 7,936,592.

(51) Int. Cl.
*G11C 11/00* (2006.01)
(52) U.S. Cl. ........ 365/158; 365/185.22; 365/185.19
(58) Field of Classification Search ......... 365/158, 365/185.22, 185.19
See application file for complete search history.

(56) References Cited

U.S. PATENT DOCUMENTS

| | | | |
|---|---|---|---|
| 6,992,359 B2 | 1/2006 | Nguyen et al. | |
| 6,999,340 B2 * | 2/2006 | Shimizu | 365/158 |
| 7,242,045 B2 | 7/2007 | Nguyen et al. | |
| 7,629,637 B2 | 12/2009 | Kajiyama et al. | |
| 7,768,824 B2 | 8/2010 | Yoshikawa et al. | |
| 7,826,255 B2 * | 11/2010 | Xi et al. | 365/158 |
| 2004/0001360 A1 | 1/2004 | Subramanian et al. | |
| 2007/0291531 A1 | 12/2007 | Nahas | |

OTHER PUBLICATIONS

L. Berger, "Emission of spin waves by a magnetic multilayer traversed by a current," Physical Review B, 1996, pp. 9353-9358, vol. 54, No. 13, The American Physical Society, US.
A. D. Kent, B. Ozyilmaz and E. Del Barco, "Spin-transfer-induced precessional magnetization reversal," Applied Physics Letters, 2004, pp. 3897-3899, vol. 84, No. 19, American Institute of Physics, US.
I. L. Prejbeanu, M. Kerekes, R. C. Sousa, H. Sibuet, O. Redon, B. Dieny and J. P. Nozieres, "Thermally assisted MRAM," Journal of Phpysics: Condensed Matter, 2007, pp. 1-23, IOP Publishing Ltd., UK.
J. C. Slonczewski, "Current-driven excitation of magnetic multilayers," Journal of Magnetism and Magnetic Materials, 1996, pp. L1-L7, Elsevier Science B. V.
J. Z. Sun, "Spin-current interaction with a monodomain magnetic body: A model study," Physical Review B, 2000, pp. 570-578, vol. 62, No. 1, The American Physical Society, US.
Yuankai Zheng, Yihong Wu, Kebin Li, Jinjun Qiu, Guchang Han, Zaibing Guo, Ping Luo, Lihua An, Zhiyong Liu, Li Wang, Seng Ghee Tan, Baoyu Zong and Bo Liu, "Magnetic Random access Memory (MRAM)," Journal of Nanoscience and Nanotechnology, 2007, pp. 117-137, vol. 7, No. 1, American Scientific Publishers, US.

* cited by examiner

*Primary Examiner* — Tuan T. Nguyen
(74) *Attorney, Agent, or Firm* — Hall Estill Attorneys at Law

(57) ABSTRACT

A method and apparatus for writing data to a non-volatile memory cell, such as a spin-torque transfer random access memory (STRAM) memory cell. In some embodiments, a selected resistive state is written to a magnetic tunneling structure by applying a succession of indeterminate write pulses thereto until the selected resistive state is verified.

20 Claims, 6 Drawing Sheets

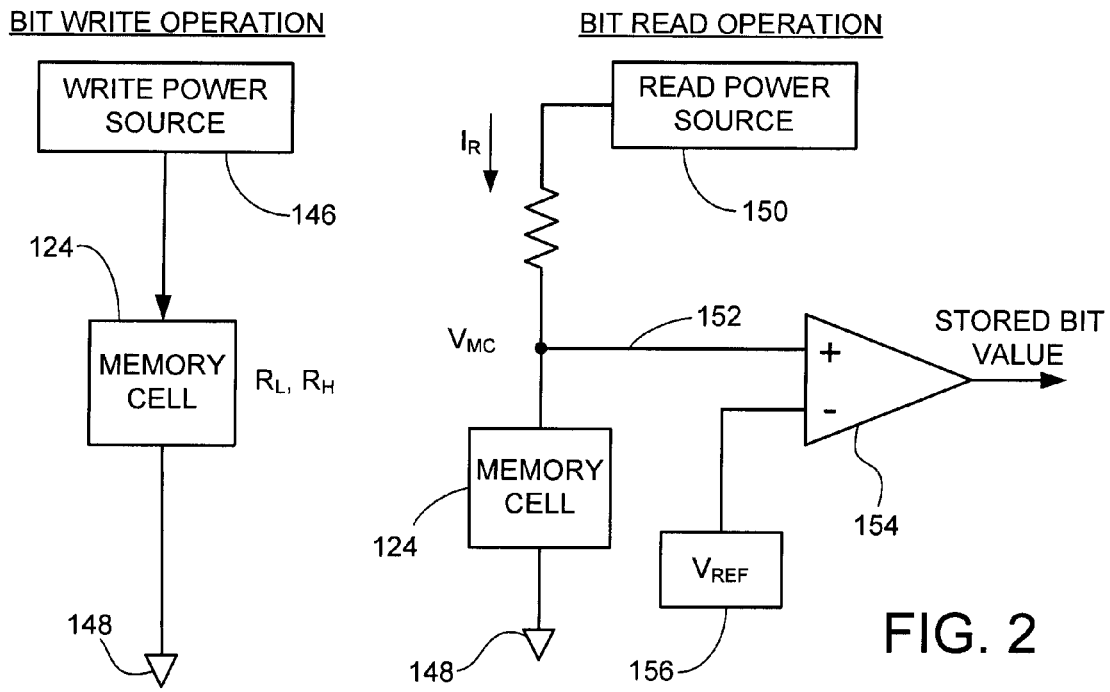
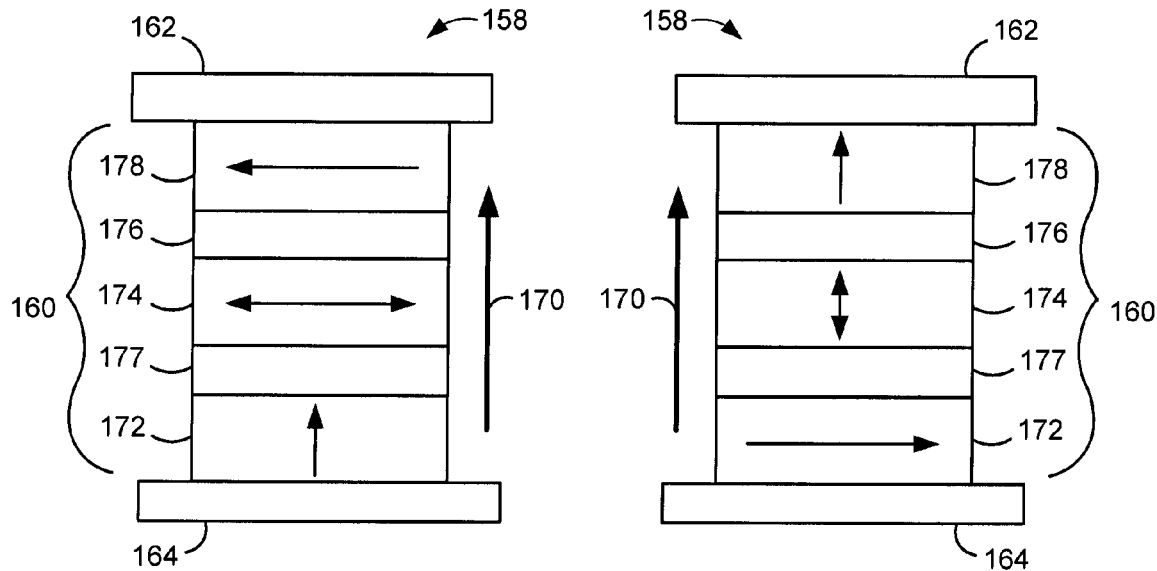

US 8,289,759 B2

NON-VOLATILE MEMORY CELL WITH PRECESSIONAL SWITCHING

BACKGROUND

Data storage devices generally operate to store and retrieve data in a fast and efficient manner. Some storage devices utilize a semiconductor array of solid-state memory cells to store individual bits of data. Such memory cells can be volatile (e.g., DRAM, SRAM) or non-volatile (RRAM, STRAM, flash, etc.).

As will be appreciated, volatile memory cells generally retain data stored in memory only so long as operational power continues to be supplied to the device, while non-volatile memory cells generally retain data storage in memory even in the absence of the application of operational power.

In these and other types of data storage devices, it is often desirable to increase efficiency and accuracy during operation, particularly with regard to the power consumption of writing data to a memory cell.

SUMMARY

Various embodiments of the present invention are generally directed to a method and apparatus for writing data to a non-volatile memory cell, such as but not limited to a STRAM memory cell.

In accordance with various embodiments, a control circuit is configured to write a selected resistive state to a magnetic tunneling structure by applying a succession of indeterminate write pulses thereto until the selected resistive state is verified.

In other embodiments, a selected resistive state is written to a magnetic tunneling structure by applying an indeterminate write pulse thereto and reapplying a succession of indeterminate write pulses thereto until the selected resistive state is verified.

These and various other features and advantages which characterize the various embodiments of the present invention can be understood in view of the following detailed discussion and the accompanying drawings.

BRIEF DESCRIPTION OF THE DRAWINGS

FIG. 1 generally illustrates a manner in which data can be written to a memory cell of the memory array.

FIG. 2 generally illustrates a manner in which data can be read from the memory cell of FIG. 1.

FIG. 3 shows a memory cell operated in accordance with various embodiments of the present invention.

FIG. 4 displays an alternative memory cell structure operated in accordance with various embodiments of the present invention.

DETAILED DESCRIPTION

Figure 5:
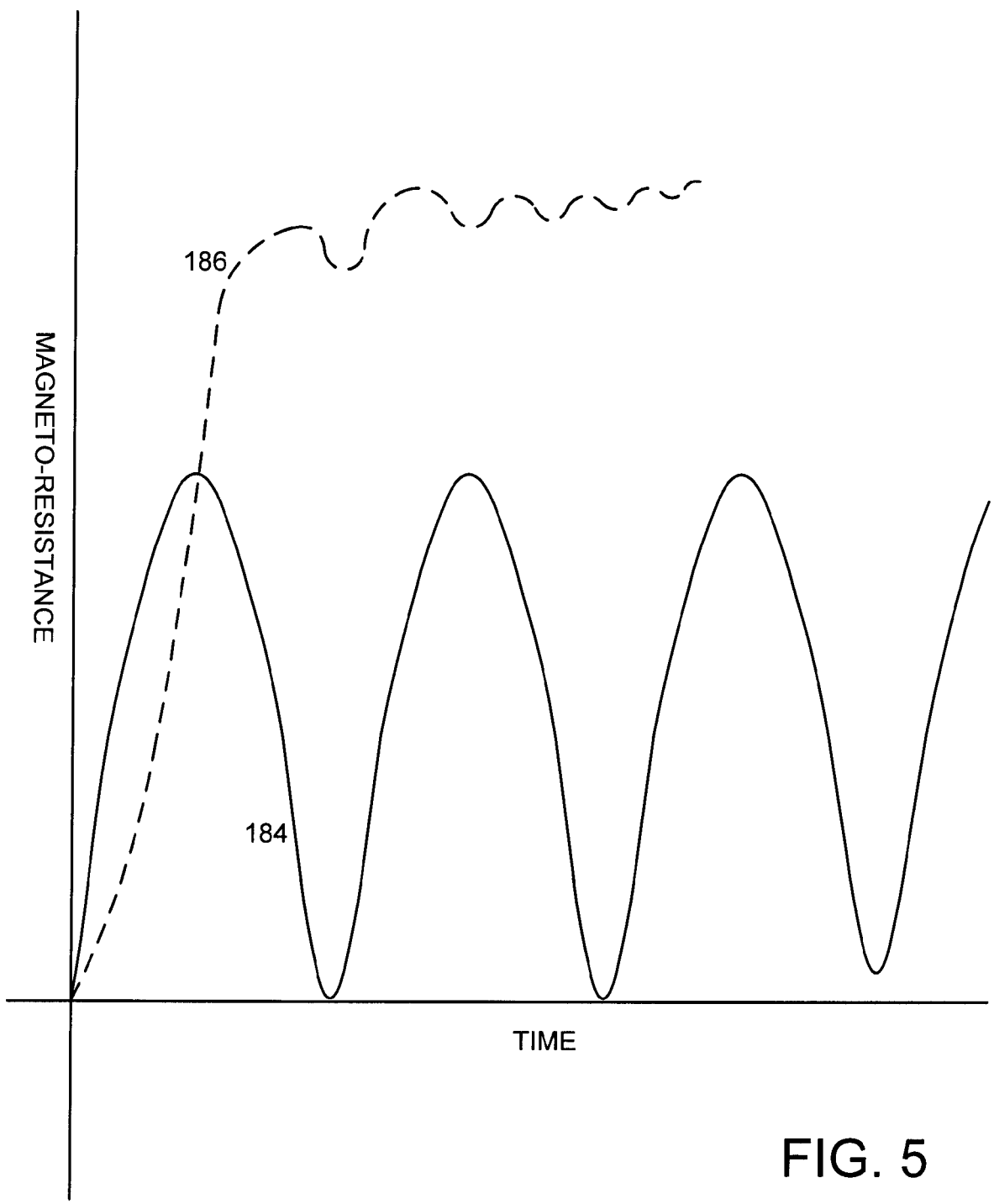
FIG. 5 generally graphs the behavior of a memory cell operated in accordance with various embodiments of the present invention.

Data are written to the respective memory cells 124 as generally depicted in FIG. 1. Generally, a write power source 146 applies the necessary input (such as in the form of current, voltage, magnetization, etc.) to configure the memory cell 124 to a desired state. It can be appreciated that FIG. 3 is merely a representative illustration of a bit write operation. The configuration of the write power source 146, memory cell 124, and reference node 148 can be suitably manipulated to allow writing of a selected logic state to each cell.

As explained below, in some embodiments the memory cell 124 takes a modified STRAM configuration, in which case the write power source 146 is characterized as a current driver connected through a memory cell 124 to a suitable reference node 148, such as ground. The write power source 146 provides a stream of power that is spin polarized by moving through a magnetic material in the memory cell 124. The resulting rotation of the polarized spins creates a torque that changes the magnetic moment of the memory cell 124.

Depending on the magnetic moment, the cell 124 may take either a relatively low resistance ($R_L$) or a relatively high resistance ($R_H$). These values are retained by the respective cells until such time that the state is changed by a subsequent write operation. While not limiting, in the present example it is contemplated that a high resistance value ($R_H$) denotes storage of a logical 1 by the cell 124, and a low resistance value ($R_L$) denotes storage of a logical 0.

The logical bit value(s) stored by each cell 124 can be determined in a manner such as illustrated by FIG. 2. A read power source 150 applies an appropriate input (e.g., a selected read voltage) to the memory cell 124. The amount of read current $I_R$ that flows through the cell 124 will be a function of the resistance of the cell ($R_L$ or $R_H$, respectively). The voltage drop across the memory cell (voltage $V_{MC}$) is sensed via path 152 by the positive (+) input of a comparator 154. A suitable reference (such as voltage reference $V_{REF}$) is supplied to the negative (−) input of the comparator 154 from a reference source 156.

The voltage reference $V_{REF}$ can be selected from various embodiments such that the voltage drop $V_{MC}$ across the memory cell 124 will be lower than the $V_{REF}$ value when the resistance of the cell is set to $R_L$, and will be higher than the $V_{REF}$ value when the resistance of the cell is set to $R_H$. In this way, the output voltage level of the comparator 154 will indicate the logical bit value (0 or 1) stored by the memory cell 124.

FIG. 3 displays a memory cell 158 configured to operate in accordance with various embodiments of the present invention. In some embodiments, the cell 158 is configured and operated in a manner that is generally similar to the memory cells 124, except as noted below. In other embodiments, the cell 158 has a configuration that is substantially different from the cells 124 in FIGS. 1 and 2.

The memory cell 158 includes a magnetic tunneling structure (MTS) 160 positioned between a first electrode 162 and a second electrode 164. The MTS 160 comprises a spin polarizer layer 172, a free layer 174 having soft magnetic properties, and a reference layer 178. A first tunnel barrier 177 facilitates spin injection from spin polarizer layer 172 to free layer 174. A second tunnel barrier 176 facilitates detection of the polarization of free layer 174. The magnetizations of free layer 174 and reference layer 178 are either parallel or anti-parallel to each other, but are perpendicular to the magnetization of the spin polarizer layer 172.

As the current pulse 170 flows through the cell 158, the top spin polarizing material 172 polarizes the spin of the current 170 in a direction perpendicular to the free in-plane magnetization of the free layer 174 and injects the current 170 into the MTS 160. The spin-polarized current 170 induces magnetization precession in free layer 174 that may settle into either parallel or anti-parallel magnetization relative to reference layer 178.

In some embodiments, the free layer 174 and reference layer 178 have the same magnetization, either in-plane or out-of-plane, that is perpendicular to the magnetization of the spin polarizing layer 172.

In further embodiments, the free layer 174 is a ferromagnetic material that has soft magnetic properties. The current pulse 170 passes through a first and sometimes a second tunnel barrier 176 (and 177) that comprise oxide material. The spin direction of the current pulse 170 dictates the magnetic phase of the free layer 174 and the resistive relationship of the cell 158 by the relationship between the free layer 174 and the magnetic phase of the reference layer 178. Alternatively, a current pulse 170 can flow through the cell 158 in the opposing direction.

It should be noted that various embodiments of the present invention are carried out with a uni-directional current flow. That is, the current pulse 170 only passes through the memory cell 158 in one direction whether writing or reading a logic state. Thus, a uni-polar current pulse can be used in a probabilistic write operation or a read operation to reduce the complexity of conventional magnetic tunneling structures that require current to flow through the cell in opposing directions to write different logic states.

FIG. 4 shows a similar memory cell 158, but reference layer 178 and free layer 174 have out of plane magnetization orientations while polarizing layer 172 is in-plane. Layers 178 and 174 have equivalent plane magnetization in this embodiment.

In FIG. 5, the memory cell 158 operated in accordance with various embodiments of the present invention is graphed. An optimal waveform of current density 184 shows the moment of the free layer 174 can precess in-plane completely. In addition, the current density required to complete precession in the memory cell 158 is smaller than conventional magnetic memory cells.

A detailed waveform of the switching current pulse 186 displays the behavior of a magnetic memory cell before and after switching magnetic phase. The magneto-resistance of the memory cell increases dramatically, but dissipates when the cell switches magnetic phase.

Figure 6:
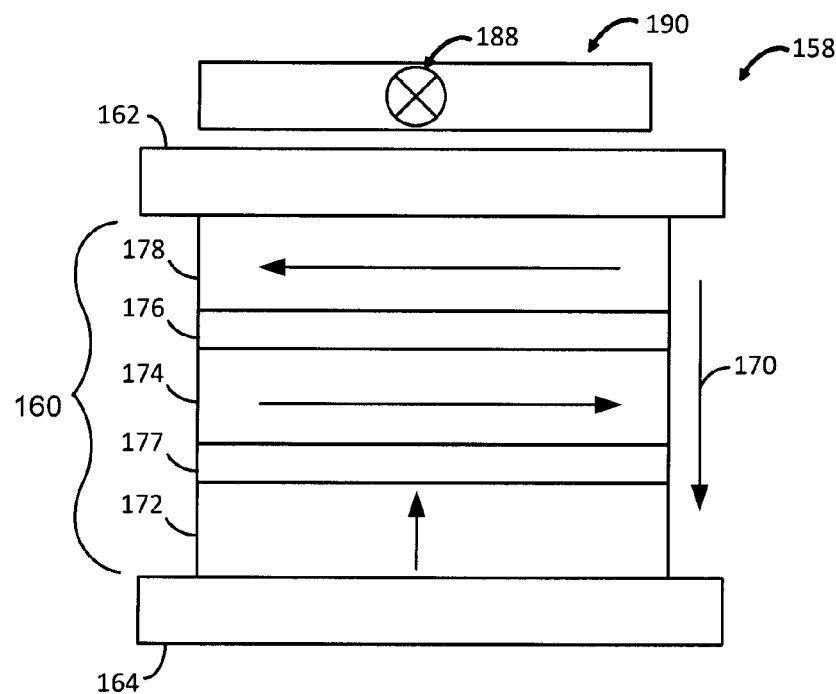
FIG. 6 shows a memory cell being operated in accordance with various embodiments of the present invention.

FIG. 6 generally illustrates a memory cell 158 of FIG. 3 being operated in accordance with various embodiments of the present invention. A set current 188 is passed through a conductor 190 that is coupled to the MTS 160 and sets the magnetic phase of the reference layer 178. An indeterminable write pulse 170 injects a magnetic phase to the free layer 174. The perpendicular spin torque generated by the spin polarizer layer 172 efficiently interacts with the free layer 172 to cause precession.

It can be appreciated by a skilled artisan that the potential of the free layer 174 to precess is a function of the write current width or duration. With a nominally pico-second pulse width, an intrinsically random resistive state results from the write pulse 170. As the free layer 174 has the indeterminable write pulse 170 pass through it, the magnetic phase could switch as the moment of the free layer 174 precesses.

Figure 7:
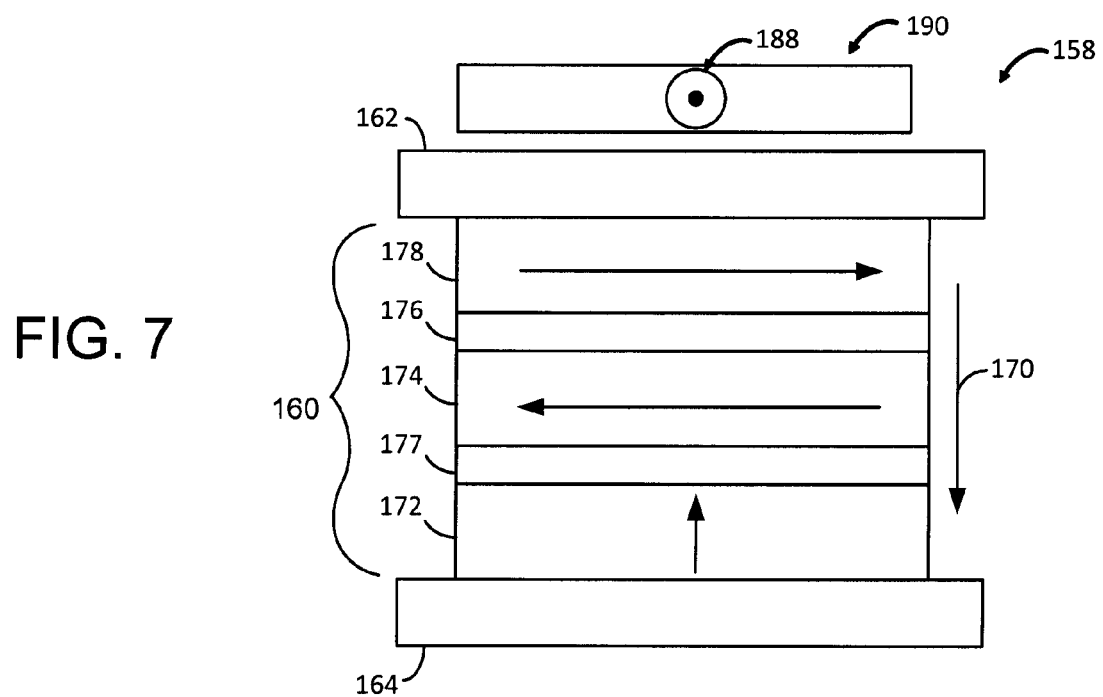
FIG. 7 displays a memory cell being operated in accordance with various embodiments of the present invention.

FIG. 7 illustrates the memory cell 158 of FIG. 3 operated in accordance with various embodiments of the present invention. The set current 188 is similar to that of FIG. 8, but is flowing through the conductor 190 in the opposing direction. The reversal of direction of the set current 188 induces a magnetic phase of the reference layer 178 that opposes the phase displayed in FIG. 6. In other words, the direction of the set current 188 dictates the magnetic phase of the reference layer 178. As a write pulse 170 injects the spin torque generated by the spin polarizer layer 172 in the free layer 174, a precession of the magnetic moment of free layer 174 can be induced.

However, the random nature of the write pulse 170 due to its nominally pico-second width provides indeterminable magnetic phase and resistive state of the magnetic tunneling structure 160. In addition, the assistance of the polarization layer 172, the current required to cause precession in the reference layer can be reduced. If the free layer 174 precesses to an opposing magnetic phase, the higher resistance of the MTS 160 will automatically cause the free layer 174 to stop the precession if the pulse 170 is not so high. Thus, the free layer's 174 magnetic moment direction can be set according to the reference layer's 178 magnetic moment direction.

Figure 8:
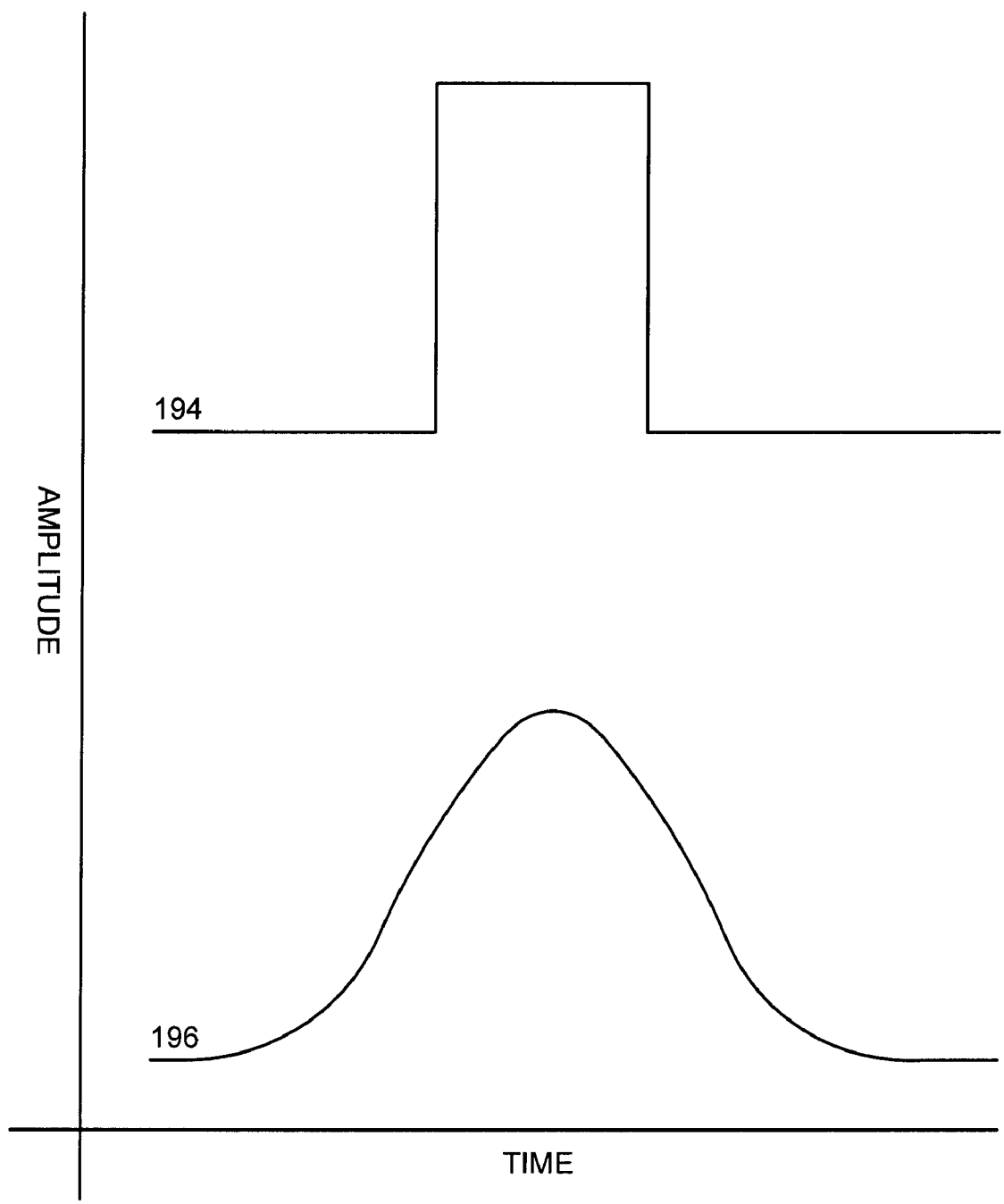
FIG. 8 provides graphical representations of pulse current widths used in accordance with various embodiments of the present invention.

In FIG. 8, a conventional pulse width 194 is graphically represented in relation to a pulse width 196 operated in accordance with the various embodiments of the present invention. The conventional pulse width 194 has consistent amplitude from the beginning of the pulse to the end. In contrast, the pulse width 196 used in various embodiment of the present invention has an indeterminable amplitude as well as beginning and end points. This indeterminable amplitude and range result from the nature variance involved with pulses close to pico-second width. Thus, a varying pulse width that is nominally a pico-second provides intrinsically random pulse amplitude and width.

In some embodiments, an optimal current pulse width is a pico-second, such as generally represented at 194 in FIG. 8. However, current technology is not capable of consistently providing a current pulse width of exactly a pico-second. Therefore, a distribution of current pulse width is achieved when attempting to stream a current pulse at a pico-second width, such as exemplified by a population distribution 196 in FIG. 8. The variation in pulse width provides the fundamentally random element to the write operation of FIG. 9 due to inability to precisely control the width of a current pulse near a pico-second, and accordingly, control (or even predict) the final magnetization orientation of the MTS free layer 174. In various embodiments of the present invention, a nominally pico-second current pulse allows for generation of a true random number.

Figure 9:
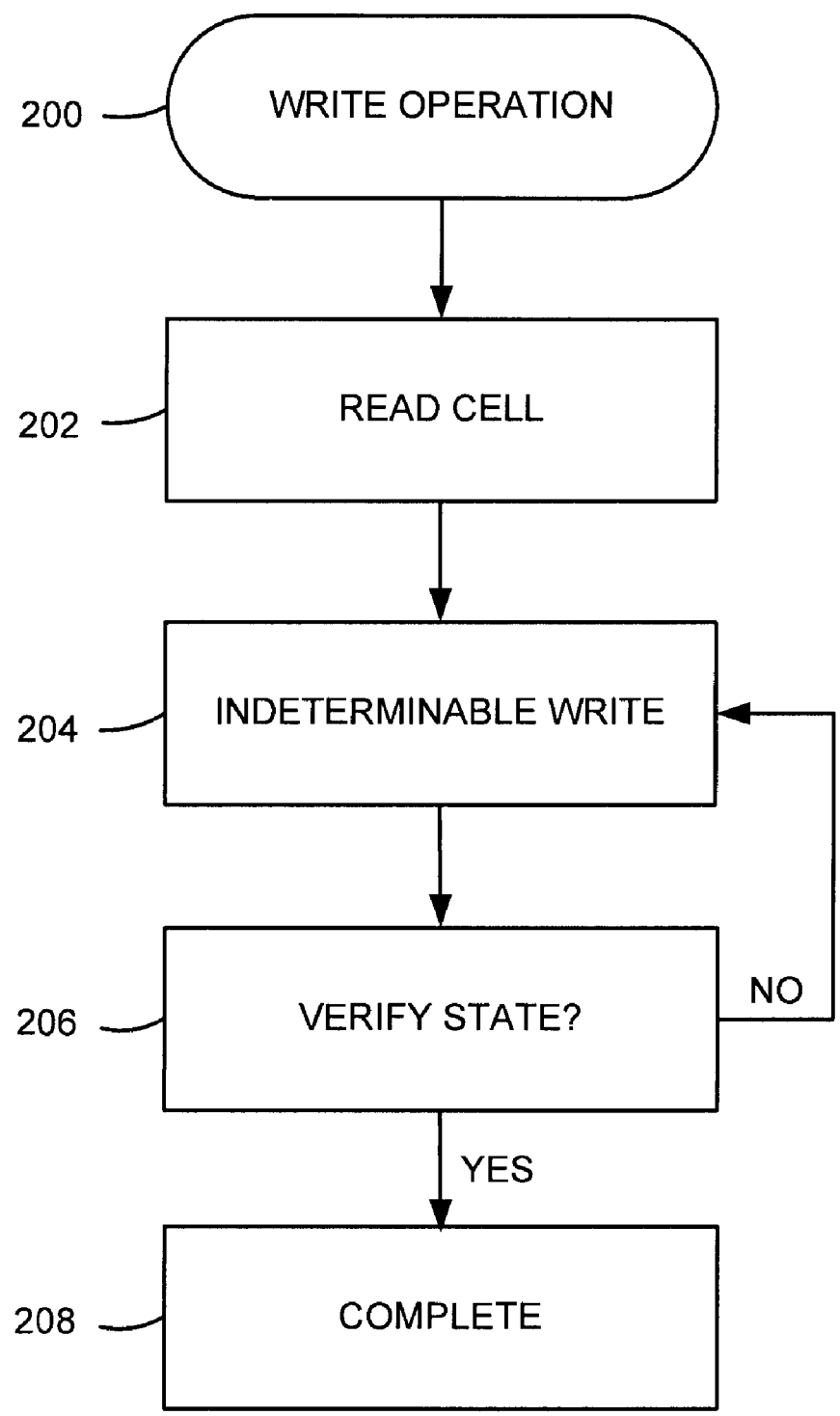
FIG. 9 provides a flow diagram of a write operation conducted in accordance with various embodiments of the present invention.

FIG. 9 displays a flow diagram of a write operation 200 performed in accordance with the various embodiments of the present invention. Initially at step 202, an MTS 160 is read to detect if the selected resistive state is present by passing a sense current through the memory cell 158. However, it is not necessary that write operation 200 start with read step 202, rather it can proceed directly to indeterminable write step 204. In some embodiments, the memory cell is read by detecting the cell resistance directly and comparing it with a reference resistance. In other embodiments, the free layer 174 is set to a predetermined phase to which the resistive state of the MTS 160 is detected and compared to the resistive state of the MTS when the free layer 174 is set to the opposing magnetic phase. The comparison of resistive states of the MTS 160 with opposing free layer 174 phases eliminates the requirement of a reference cell.

If the resistive state of the MTS 160 is not the selected state, an indeterminable write pulse 192 will be injected in the memory cell 158 at step 204. The nominally pico-second write pulse width provides a random opportunity to cause the free layer 174 to precess and switch magnetization phase. The free layer 174 of an MTS 160 has a certain magnetic moment as it holds a certain phase. When a spin torque is injected in the free layer 174 at a great enough density, the magnetic moment precesses and moves at microwave frequencies around the symmetry axis with ever increasing amplitude until it reverses its phase. However, the magnetic moment of the free layer 174 cannot be precisely measured due to such factors as variance in the material composition, manufacturing, and the write current that induced the present magnetic phase. Thus, the magnetic moment of a number of MTS 160 is random. Thus, at step 204, the injection of a write pulse 192 provides an opportunity for precession being induced by the spin torque.

It can be appreciated by the skilled artisan that the injected spin torque may not induce precession with every write pulse 170. As a nominally pico-second width current pulse is injected in the free layer, the free layer can precess and change phase, maintain phase but reduce the magnetic moment, or maintain phase with a substantially similar moment. Therefore, the inducement of precession at step 204 is random and is affected by several factors including, but not limited to, the magnetic moment of the free layer 174, the current pulse width, and the thermal noise of the MTS 160.

After the spin torque has been injected in the free layer, the free layer will settle to equilibrium in a logical state that can be verified at step 206. The settlement of the free layer will result from the magnetic moment becoming stable, either from changing phase or maintaining a consistent moment. The resistive state of the memory cell 158 can be read in variety of ways, but the options are the same as for the read function of step 202. The result of the verify operation at step 206 determines if a subsequent indeterminable write is undertaken or whether the write operation 200 is complete.

If the resistive state of the memory cell 158 is satisfactory, the write operation completes at step 208. However, a cyclic indeterminable write and verify is undertaken until the proper resistive state is present in the MTS 160.

It should be noted that the final magnetization settlement state is influenced most by the current pulse width. The pulse width variation in the pico-second range results in the random precessional magnetization settlement of a free layer of an MTS. The addition of thermal fluctuation at finite temperature of the MTS 160 makes the switching process intrinsically random.

Figure 10:
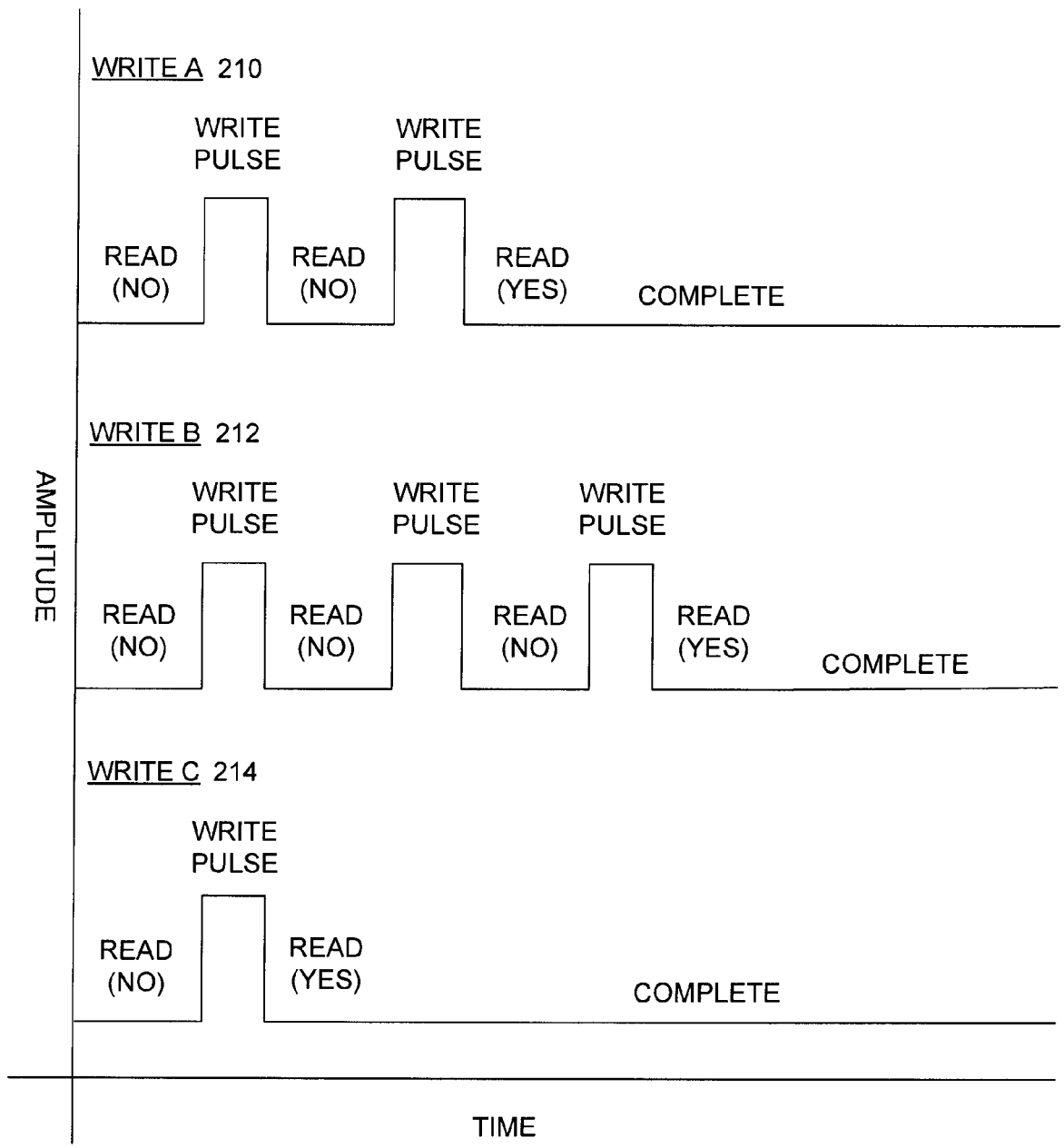
FIG. 10 provides a graphical representation of the write operation of FIG. 9 when conducted in accordance with various embodiments of the present invention.

FIG. 10 provides a graphical representation of the write operation of FIG. 9 when conducted in accordance with various embodiments of the present invention. For a write A operation 210, an initial read is followed by an indeterminable write pulse that is not satisfactorily verified in the subsequent read. A successive indeterminable write pulse follows the failed read operation. With a verified resistive state after the second indeterminable write pulse, the write A operation 210 is completed.

Alternatively, a write B operation 212 begins by reading the resistive state of the memory cell 158. An unwanted resistive state keys an indeterminable write pulse that is immediately read. If the read fails to return the desired resistive state, a successive indeterminable write pulse is injected into the MTS 160 and subsequently read. A second failure to induce the correct resistive state dictates a third indeterminable write pulse. With the resistive state being verified, write B operation 212 completes.

Further in an alternative embodiment, a single indeterminable write pulse correctly results in the selected resistive state in write C operation 214. A read operation that immediately follows the write pulse and verifies the proper resistive state takes the write C operation 212 to completion.

Due to symmetry of the configuration, there is equal probability for the magnetization to settle down into either of the two logic states after one, or many, indeterminable write pulses. While the direction of polarization is not limited to the perpendicular direction, perpendicular polarization provides the maximum spin torque to induce precession of the free layer 174.

In application, the spin polarization direction can be optimized to achieve maximum spin torque to induce precession. Similarly, the spin polarized current amplitude for precessional magnetization motion can be made extremely small. The threshold current for precessional magnetization switching goes to zero as in-plan anisotropy goes to zero.

As can be appreciated by one skilled in the art, the various embodiments illustrated herein provide advantages in both memory cell speed and reliability for the writing of data. The indeterminable writing of data allows for reduced requirements for the control of write current pulses. In addition, current amplitude and magnetic phase switching speed is improved by the uni-polar write current in a nominally pico-second pulse width. Moreover, the efficiency of the memory cell 158 is greatly improved due to the utilization of perpendicular magnetic moments to induce precession. However, it will be appreciated that the various embodiments discussed herein have numerous potential applications and are not limited to a certain field of electronic media or type of data storage devices.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A storage device comprising:
   an array of non-volatile memory cells each comprising a magnetic tunneling junction (MTJ); and
   a control circuit adapted to write data to the array by applying a plurality of successive indeterminate write current pulses to a selected memory cell of the array, the control circuit applying a read current to the selected memory cell between at least some of the write current pulses to verify a written state of the selected memory cell.

2. The storage device of claim 1, in which each MTJ comprises a free layer having a variable magnetic orientation, a reference layer having a fixed magnetic orientation, and a tunnel barrier layer between the free layer and the reference layer.

3. The storage device of claim 1, in which each of the plurality of successive indeterminate write current pulses uses spin torque to induce precessional motion in a layer of the MTJ.

4. The storage device of claim 1, in which a duration of each of the plurality of successive indeterminate write current pulses is within the range of about a pico-second to about a nano-second.

5. The storage device of claim 1, in which the control circuit is further adapted to generate a random number responsive to said plurality of successive indeterminate write current pulses.

6. The storage device of claim 1, in which the write pulse uses spin torque to induce precessional motion in a layer of the MTJ.

7. The storage device of claim 1, in which each of the write current pulses and the read currents are applied in a common direction through the selected memory cell.

8. The storage device of claim 1, in which the selected memory cell is characterized as a semiconductor stack of magnetically responsive layers.

9. The storage device of claim 1, in which the control circuit reads a resistive state of the MTJ of the selected memory cell after each indeterminable write pulse.

10. A memory device, comprising:
an array of non-volatile memory cells each comprising an axially arranged stack of magnetically responsive layers including at least one unpinned free layer; and
a control circuit adapted to write data to the array by sequentially applying an indeterminate write current pulse to a selected memory cell followed by applying a read current to the memory cell to detect a resistive state of the cell, wherein the control circuit continues sequential application of said indeterminate write current pulses and read currents until the detected resistive state of the cell is determined to be at a desired state.

11. The memory device of claim 10, in which the indeterminate write current pulses use spin torque to induce precessional motion in the at least one unpinned free layer of the selected memory cell.

12. The memory device of claim 10, in which the control circuit is further adapted to repeat said sequential application of indeterminate write current pulses and read currents to a plurality of memory cells adjacent to the selected memory cell to write host user data to the array.

13. The method of claim 11, wherein a duration of each of the succession of indeterminate write pulses is within the range of about a pico-second to about a nano-second.

14. The memory device of claim 10, in which the array is characterized as an array of spin-torque transfer random access memory (STRAM) cells.

15. The memory device of claim 10, in which the succession of write current pulses are uni-polar irrespective of the final desired resistive state of the selected memory cell.

16. The memory device of claim 10, in which each of the memory cells in the array comprises a magnetic tunneling junction (MTJ) has a plurality of layers, including a free layer and a reference layer.

17. A method comprising:
applying an indeterminate write current pulse to a selected memory cell in a non-volatile memory array;
passing a read current through the selected memory cell to detect a programmed resistive state of the selected memory cell; and
repeating the applying and passing steps until the passing step indicates that the programmed resistive state of the selected memory cell is at a desired state.

18. The method of claim 17, further comprising generating a random number responsive to the applying and passing steps.

19. The method of claim 17, in which the indeterminate write current pulse of the applying step is on the order of about one pico-second in duration.

20. The method of claim 17, in which the programmed resistive state of the selected memory cell detected during the passing step is determined responsive to relative magnetization orientations of a reference layer and a free layer of the selected memory cell, and the indeterminate write current pulse of the applying step has a duration that randomly sets the magnetization orientation of the free layer.

* * * * *